(12) United States Patent
Lu et al.

(10) Patent No.: US 11,698,432 B2
(45) Date of Patent: Jul. 11, 2023

(54) MAGNETIC RESONANCE IMAGING SYSTEM, AND MAIN MAGNETIC FIELD CORRECTION METHOD THEREFOR AND STORAGE MEDIUM

(71) Applicant: GE PRECISION HEALTHCARE LLC, Wauwatosa, WI (US)

(72) Inventors: Qilin Lu, Beijing (CN); Xihui Ju, Beijing (CN); Tao Wang, Beijing (CN); Kun Wang, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/656,325

(22) Filed: Mar. 24, 2022

(65) Prior Publication Data

US 2022/0317222 A1 Oct. 6, 2022

(30) Foreign Application Priority Data

Mar. 31, 2021 (CN) .......................... 202110348953.7

(51) Int. Cl.
*G01R 33/565* (2006.01)
*G01R 33/54* (2006.01)
*G01R 33/58* (2006.01)
*G01R 33/56* (2006.01)

(52) U.S. Cl.
CPC ..... *G01R 33/56563* (2013.01); *G01R 33/543* (2013.01); *G01R 33/5608* (2013.01); *G01R 33/583* (2013.01)

(58) Field of Classification Search
None
See application file for complete search history.

(56) References Cited

U.S. PATENT DOCUMENTS

2016/0259024 A1* 9/2016 Bachschmidt ........ G01T 1/1603
2017/0371010 A1* 12/2017 Shanbhag ............... A61B 5/055
2018/0267126 A1* 9/2018 Shi .......................... G06T 5/003

* cited by examiner

*Primary Examiner* — Rodney E Fuller

(57) ABSTRACT

A main magnetic field correction method for a magnetic resonance imaging system includes: obtaining an estimated image of a phantom based on a first imaging sequence, the first imaging sequence having a variable resonant frequency; pre-correcting a main magnetic field based on the estimated image; obtaining a scanned image of the phantom based on the pre-corrected main magnetic field; and determining whether the quality of the scanned image is within an acceptable range, and if not, returning to the step of obtaining the estimated image.

11 Claims, 8 Drawing Sheets

MAGNETIC RESONANCE IMAGING SYSTEM, AND MAIN MAGNETIC FIELD CORRECTION METHOD THEREFOR AND STORAGE MEDIUM

CROSS REFERENCE

The present application claims priority and benefit of Chinese Patent Application No. 202110348953.7 filed on Mar. 31, 2021, which is incorporated herein by reference in its entirety.

FIELD OF THE INVENTION

Embodiments disclosed in the present invention relate to medical imaging technologies, and more particularly relate to a magnetic resonance imaging system, a main magnetic field correction method for the magnetic resonance imaging system, and a computer-readable storage medium.

BACKGROUND OF THE INVENTION

Magnetic resonance imaging (MRI), as a medical imaging modality, can obtain images of the human body without using X-rays or other ionizing radiation.

MRI utilizes a magnet having a strong magnetic field to generate a static magnetic field (or main magnetic field) B0. When a part to be imaged of the human body is positioned in the static magnetic field B0, nuclear spin associated with hydrogen nuclei in human tissues is polarized. The tissue of the part to be imaged thus generates a longitudinal magnetization vector at a macroscopic level, which is in a balanced state. After a radio-frequency field B1 intersecting the direction of the static magnetic field B0 is applied, the direction of rotation of protons changes, the longitudinal magnetization vector decays, and the tissue of the part to be imaged generates a transverse magnetization vector at a macroscopic level. After the radio-frequency field B1 is removed, the longitudinal magnetization strength is gradually restored to the balanced state, the transverse magnetization vector decays in a spiral manner until it is restored to zero. A free induction decay signal is generated during decay of the transverse magnetization vector. The free induction decay signal can be acquired as a magnetic resonance signal, and a tissue image of the to-be-imaged part can be reconstructed on the basis of the acquired signal.

In order to guarantee the magnetic resonance imaging quality, the main magnetic field in the examination space (such as a scanning chamber defined by a main magnet) at least needs to have desirable uniformity, which is achieved by performing uniformity correction on the main magnetic field, which is also known as shimming.

In a conventional correction approach, magnetometers are needed to measure the magnetic field strength in the scanning chamber. In order to do so, it is necessary to dispose a plurality of magnetometers on a support or a similar apparatus and mount the support in the scanning chamber. The support is then manually rotated to move the magnetometer to a position in a scanning space where measurement is to be performed to measure the magnetic field strength. Shimming is subsequently performed on the basis of the measured magnetic field strength. For example, shimming pieces are added to the main magnet to adjust the magnetic field strength of a specific position.

In addition to being costly and having a complicated structure, such a measuring device is difficult to operate, and the process is time-consuming. Particularly, in remote geographical locations where a single measuring device is shared by a number of far apart medical institutions, high transportation costs are incurred, and damage is easily caused during transportation. The medical institutions thus have to spend considerable time on communicating and waiting.

The correction data of the main magnetic field may also be obtained based on phantom imaging. However, when uniformity of the main magnetic field is poor, complexity of the uniformity correction is very high.

BRIEF DESCRIPTION OF THE INVENTION

An aspect of the present invention provides a main magnetic field correction method for a magnetic resonance imaging system. The method comprises obtaining an estimated image of a phantom based on a first imaging sequence having a variable resonant frequency and pre-correcting a main magnetic field based on the estimated image. The method further comprises obtaining a scanned image of the phantom based on the pre-corrected main magnetic field; and determining whether the quality of the scanned image is within an acceptable range, and if not, returning to the step of obtaining the estimated image of the phantom.

Alternatively, the step of obtaining the estimated image comprises imaging the phantom respectively based on a plurality of radio-frequency excitation pulses to obtain a plurality of images to be synthesized, the plurality of radio-frequency excitation pulses having different frequencies; and synthesizing the plurality of images to be synthesized to generate the estimated image.

Alternatively, the first imaging sequence is a MAVRIC sequence.

Alternatively, the scanned image is obtained based on the pre-corrected main magnetic field and a second imaging sequence.

Alternatively, the step of determining whether the quality of the scanned image is within an acceptable range comprises: determining whether a deformation degree of the phantom in the scanned image is within an acceptable range by comparing the scanned image with a pre-stored standard image.

Alternatively, if the quality of the scanned image is within an acceptable range, performing accurate shimming on the pre-corrected main magnetic field.

Alternatively, the accurate shimming comprises obtaining a first shimming image and a second shimming image of the phantom based on a third imaging sequence, the first shimming image and the second shimming image having a phase offset therebetween; and performing shimming correction on the pre-corrected main magnetic field based on a phase difference between the first shimming image and the second shimming image.

Alternatively, the third imaging sequence comprises a radio-frequency excitation pulse, a radio-frequency refocusing pulse, a layer selection gradient pulse, a phase encoding pulse, a first frequency encoding pulse, and a second frequency encoding pulse, the first frequency encoding pulse and the second frequency encoding pulse being adjacent and having a preset interval, wherein the first frequency encoding pulse is used to generate first echo data to generate the first shimming image, and the second frequency encoding pulse is used to generate second echo data to generate the second shimming image.

Another aspect of the present invention provides a main magnetic field correction method for a magnetic resonance imaging system. The method comprises performing a first imaging sequence having a variable resonant frequency on a phantom to obtain a set of images of the phantom, and synthesizing the set of images to generate an estimated image of the phantom. The method further comprises pre-correcting the main magnetic field based on the estimated image and scanning the phantom based on the pre-corrected main magnetic field to obtain a scanned image. Moreover, the method comprises determining whether a deformation degree of the phantom in the scanned image is lower than a preset threshold; and if not, adjusting a plurality of resonant frequencies of the first imaging sequence and returning to the step of performing the first imaging sequence on the phantom, and if so, performing accurate shimming on the pre-corrected main magnetic field.

Another aspect of the present invention further provides a computer-readable storage medium, the computer-readable storage medium comprising a stored computer program, wherein the method according to any one of the aforementioned aspects is performed when the computer program is run.

Another aspect of the present invention provides a magnetic resonance imaging system. The system comprises a scanner, for scanning an object to obtain image data of the object, the object comprising a phantom and an image reconstructor, for reconstructing an image of the object based on the image data. The system further comprises an image analysis processor, for obtaining correction data and image quality determination data of a main magnetic field based on the image of the object; and a controller, for controlling the scanner, the image reconstructor, and the image analysis processor to perform the method according to any one of the aforementioned aspects.

It should be understood that the brief description above is provided to introduce, in simplified form, some concepts that will be further described in the Detailed Description. The brief description above is not meant to identify key or essential features of the claimed subject matter. The scope is defined uniquely by the claims that follow the detailed description. Furthermore, the claimed subject matter is not limited to implementations that solve any disadvantages noted above or in any section of the present disclosure.

BRIEF DESCRIPTION OF THE DRAWINGS

The present invention will be better understood by reading the following description of non-limiting embodiments with reference to the accompanying drawings, where.

DETAILED DESCRIPTION

Figure 1:
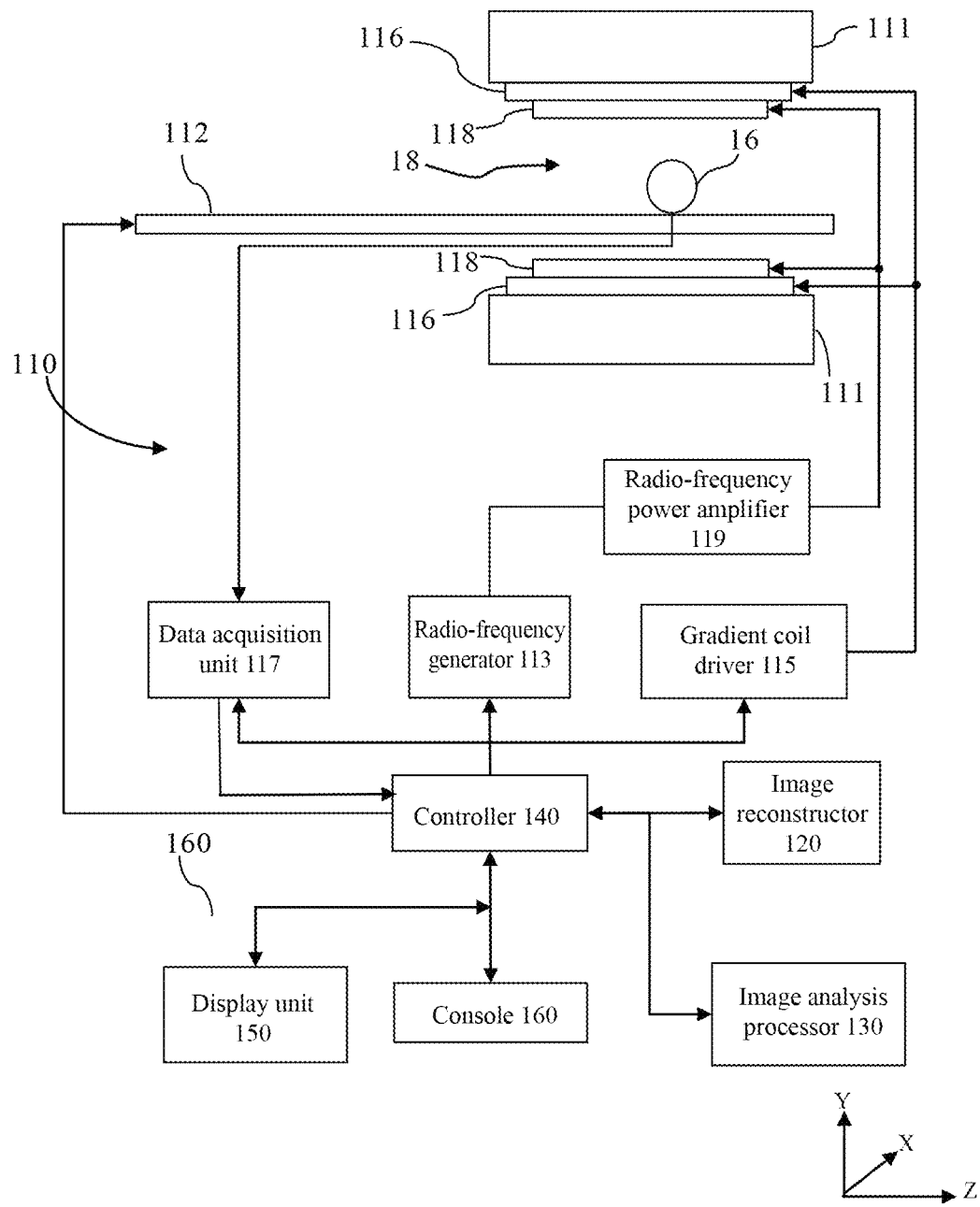
FIG. 1 is a schematic structural diagram of a magnetic resonance imaging system according to an embodiment of the present invention.

FIG. 1 is a schematic structural diagram of a magnetic resonance imaging system according to an embodiment of the present invention. The magnetic resonance imaging system includes a scanner 110, an image reconstructor 120, an image analysis processor 130, and a controller 140. The controller 140 is coupled to the scanner 110 and configured to control operation of the scanner 110, such as controlling the scanner 110 to perform a scanning sequence on an object 16 to obtain image data of the object 16. The controller 140 is further configured to communicate with the image reconstructor 120 to control the image reconstructor 120 to reconstruct the image of the object 16 based on the image data obtained by the scanner. The controller 140 is further configured to communicate with the image analysis processor 130 to control the image analysis processor 130 to analyze or process reconstructed or raw image data of the object, such analysis or processing may include, for example, obtaining correction/shimming data of the main magnetic field based on the image of the object, and may further include, for example, determining/evaluating the quality of the image of the object.

When scanning and imaging a human body, the object 16 may be a human anatomy to be diagnosed; when main magnetic field evaluation or correction/shimming is performed, the object 16 may be a phantom, and the controller 140 may control the scanner 110 to obtain image data of the phantom, and control the image reconstructor to reconstruct the image of the phantom based on the image data of the phantom, and may further control the image analysis processor 130 to evaluate, based on the image of the phantom, uniformity of the main magnetic field in a space where the phantom is located, and obtain correction data/shimming data of the main magnetic field based on an evaluation result.

Specifically, the controller 140 may send a sequence control signal to relevant components (such as a radio-frequency generator and a gradient coil driver that will be described below) of the scanner 110 by means of a sequence generator (not shown in the figure), such that the scanner 110 executes a preset imaging sequence. In an embodiment, the imaging sequence may include one or more imaging sequences for uniformity correction of the main magnetic field. In the embodiments of the present invention, the uniformity correction of the main magnetic field may include pre-correction, and may further include accurate correction/shimming.

Those skilled in the art would understand that the "imaging sequence" refers to a combination of pulses having specific amplitudes, widths, directions, and time sequences and is applied when a magnetic resonance imaging scan is performed. The pulses may typically include, for example, a radio-frequency pulse and a gradient pulse. The radio-frequency pulses may include, for example, a radio-frequency transmit pulse for exciting protons in the body to resonate. The gradient pulses may include, for example, a slice selection gradient pulse, a phase encoding gradient pulse, a frequency encoding gradient pulse, etc.

In an example, the scanner 110 may include a main magnet assembly 111, a table 112, a radio-frequency generator 113, a radio-frequency transmitting coil 114, a gradient coil driver 115, a gradient coil assembly 116, a radio-frequency power amplifier 119, and a data acquisition unit 117.

The main magnet assembly 111 usually includes an annular superconducting magnet defined in a housing. The annular superconducting magnet is mounted in an annular vacuum container. The annular superconducting magnet and the housing thereof define a cylindrical space surrounding the object 16, namely, a main magnetic field space such as the scanning chamber 18 shown in FIG. 1. The scanning chamber 18 defines an imaging region of the magnetic resonance imaging system or at least part of the imaging region. The main magnet assembly 111 generates a constant magnetic field, e.g., a main magnetic field B0, in a Z direction of the scanning chamber 18. Typically, a uniform portion of the main magnetic field B0 is formed in a central region of the main magnet.

The table 112 is configured to carry the object 16, and travel in the Z direction to enter or exit the aforementioned scanning chamber 18 in response to the control of the controller 140. For example, in one embodiment, an imaging volume of the object 16 may be positioned in a central region of the scanning chamber having uniform magnetic field strength so as to facilitate scanning imaging of the imaging volume of the object 16. For example, the phantom may be positioned at an appropriate position in a main magnetic field space, so as to measure a magnetic field strength in the main magnetic field space.

The magnetic resonance imaging system transmits a static magnetic pulse signal using the formed main magnetic field B0 to the object 16 (e.g., the phantom) placed in the scanning chamber 18, so that protons in resonant volumes of the object 16 precess in an ordered manner to generate a longitudinal magnetization vector.

The radio-frequency generator 113 and the radio-frequency power amplifier 119 may serve as part of a radio-frequency transmit chain. The radio-frequency generator 113 is used to generate a radio-frequency pulse in response to a control signal of the controller 140. The radio-frequency pulse is usually a small radio-frequency signal having low power. The small radio-frequency signal may be amplified by the radio-frequency power amplifier 119, and then applied to the radio-frequency transmitting coil 114.

The radio-frequency transmitting coil 114 may be a body coil connected to a transmit/receive (T/R) switch. The radio-frequency transmitting coil 114 can be switched between a transmit mode and a receive mode by controlling the transmit/receive switch. In the transmit mode, the radio-frequency transmitting coil 114 is used, in response to the aforementioned radio-frequency excitation pulse, to transmit to the object 16 a radio-frequency field B1 orthogonal to the static magnetic field B0, so as to excite nuclei in the body of the object 16, so that a longitudinal magnetization vector is converted into a transverse magnetization vector. In the receive mode, the body coil may be used to receive a magnetic resonance signal from the object 16.

After the end of the radio-frequency excitation pulse, a free induction decay signal is generated during the process in which the transverse magnetization vector of the object 16 is gradually being restored to zero.

The gradient coil driver 115 is configured to provide a suitable current/power to the gradient coil assembly 116 in response to a gradient pulse control signal or a shimming control signal sent from the controller 140.

The gradient coil assembly 116 forms a varying magnetic field in an imaging space so as to provide three-dimensional position information to the magnetic resonance signal, and furthermore, generates a compensating magnetic field of the main magnetic field B0 used to perform shimming on the main magnetic field B0.

The gradient coil assembly 116 may include three gradient coils, which are respectively configured to generate magnetic field gradients inclined to three spatial axes (for example, the X-axis, Y-axis, and Z-axis) perpendicular to each other. More specifically, the gradient coil assembly 116 applies a magnetic field gradient in a slice selection direction (such as the Z direction) so as to select a layer in the imaging volume. Those skilled in the art would understand that the layer is any one of a plurality of two-dimensional slices distributed in the Z direction in the three-dimensional imaging volume. The aforementioned "Z-direction" is generally a direction extending from the head to the feet when a patient is positioned on the table 112. When a scan is performed on the object, the radio-frequency transmitting coil 114 transmits a radio-frequency excitation pulse to the layer of the imaging volume and excites the layer. The gradient coil assembly 116 applies a magnetic field gradient in a phase encoding direction (such as the Y direction) so as to perform phase encoding on a magnetic resonance signal of the excited layer. The gradient coil assembly 116 applies a gradient field in a frequency encoding direction (such as the X direction) of the object 16 so as to perform frequency encoding on the magnetic resonance signal of the excited layer.

The data acquisition unit 117 is configured to acquire the aforementioned magnetic resonance signal (received by the body coil or the surface coil, for example) in response to a data acquisition control signal of the controller 140. In one embodiment, the data acquisition unit 117 may include, for example, a radio-frequency preamplifier, a phase detector, and an analog/digital converter, where the radio-frequency preamplifier is configured to amplify the magnetic resonance signal, the phase detector is configured to perform phase detection on the amplified magnetic resonance signal, and the analog/digital converter is configured to convert the phase-detected magnetic resonance signal from an analog signal to a digital signal.

The digitized magnetic resonance signal may be received as raw image data by the image reconstructor 120, and the image reconstructor 120 may reconstruct a two-dimensional slice image of the object 16 based on the above digitized magnetic resonance signal. Specifically, the image reconstructor 120 may perform the aforementioned image reconstruction on the basis of communication with the controller 140.

The image analysis processor 130 may perform any required image analysis and processing on the aforementioned reconstructed image or raw image data, for example, determining image quality via image analysis, determining uniformity of the main magnetic field, and further obtaining the correction data of the main magnetic field, and as another example, improving image contrast, uniformity, sharpness, brightness, and the like through image processing. Specifically, the image analysis processor 130 may perform the aforementioned image analysis and processing on the basis of communication with the controller 140.

The magnetic resonance imaging system may further include a displayer 150. The displayer 150 may be used to display an operation interface and various data or images generated in the data processing process.

The magnetic resonance imaging system further includes a console 160, and the console 160 may include user input devices, such as a keyboard and a mouse. The controller 140 may generate control signals in response to control commands generated by the user via the operating console 160, the operation panel/keys, and the like provided on a main magnet housing, and some automatic detection results to control, for example, the scanner 110, the image reconstructor 120, the image analysis processor 130, the displayer 150, and the like to perform corresponding operations.

In an embodiment, the controller 140, the image reconstructor 120, and the image analysis processor 130 may separately or collectively include a computer and a storage medium. The storage medium records a predetermined control program and data processing program to be executed by the computer. For example, the storage medium may store a program for implementing imaging scanning, image reconstruction, image processing, etc. For example, the storage medium may store a program for implementing the main magnetic field correction method according to embodiments of the present invention. The storage medium may include, for example, a ROM, a floppy disk, a hard disk, an optical disk, a magneto-optical disk, a CD-ROM, or a non-volatile memory card.

The aforementioned magnetic resonance imaging system is described only as one example. In other embodiments, the device may have various variations.

Figure 2:
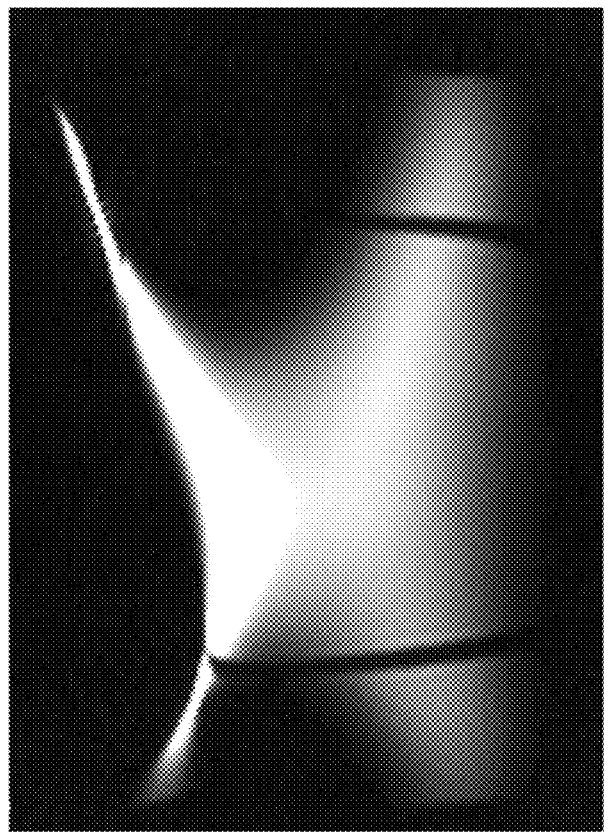
FIG. 2 is a flowchart of a main magnetic field correction method for a magnetic resonance imaging system according to an embodiment of the present invention.

Based on the aforementioned description, in a process of imaging the object, ensuring that the main magnetic field is sufficiently uniform helps to reduce artifacts and obtain higher image quality. Therefore, the main magnetic field may usually be calibrated by using the imaging data of the phantom. When the main magnetic field has better uniformity, a generated phantom image may be less deformed, and main magnetic field correction is easier to be performed based on such an image. However, when the uniformity of the main magnetic field is poor, the deformation degree of the phantom in the generated image is too large (as shown in FIG. 2), making it difficult to determine a source of non-uniformity (for example, positions of the main magnetic field that are not uniform). In this case, a large quantity of complex calculations or attempts may be required to obtain relatively accurate main magnetic field correction data.

Figure 3:
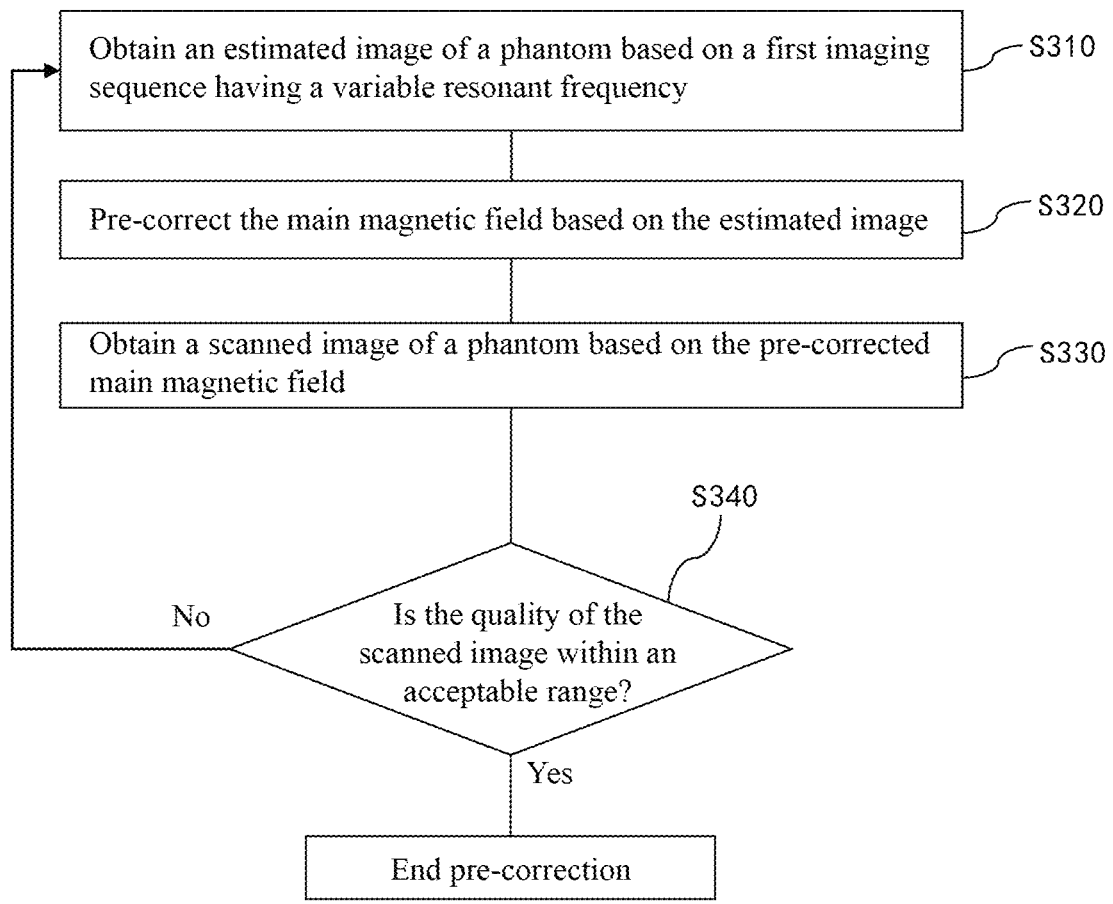
FIG. 3 is an example of a phantom image having a large deformation generated based on a main magnetic field having poor uniformity.

FIG. 3 is a flowchart 300 of a main magnetic field correction method according to an embodiment of the present invention.

In step S310, an estimated image of a phantom is obtained based on a first imaging sequence having a variable resonant frequency. The aforementioned "having a variable resonant frequency" may indicate that the first imaging sequence includes a plurality of radio-frequency transmit pulses applied in sequence, where frequencies of the plurality of radio-frequency transmit pulses are different from each other, and since the phantom is respectively excited by transmitted pulses having different resonant frequencies, a plurality of sets of corresponding image data are generated. In each set of image data, a part of the phantom may be better represented (a resonance frequency at the main magnetic field where this part is located is closer to a corresponding resonant frequency), while other parts (a resonance frequency at the main magnetic field where this part is located has a larger deviation from the resonant frequency) are poorly represented.

Therefore, the image data generated at the plurality of resonant frequencies may be processed to pre-estimate complete image data of the phantom. A difference between the complete image data and a scanned image obtained by performing image reconstruction based on one complete scanned data is that such an estimate may vary in different aspects due to different image processing algorithms. In the embodiments of the present invention, the estimated image may be generated by synthesizing the plurality of sets of images (or image data), the synthesis may include taking different parts of the plurality of sets of image data (for example, a part with better image quality) for synthesis, and an amplitude weighted interpolation algorithm may be further performed between adjacent two sets of data.

In an embodiment, step S310 may include: imaging the phantom respectively based on a plurality of radio-frequency excitation pulses, to obtain a plurality of images to be synthesized, and synthesizing the plurality of images to be synthesized to generate the estimated image. The plurality of radio-frequency excitation pulses have different frequencies.

As an example, the first imaging sequence may be MAVRIC (MultiAcquisition with Variable Resonance Image Combination), and those skilled in the art would understand that this sequence may be used to image human tissue having implants so as to avoid metal artifacts in an image of the human tissue. However, in the embodiments of the present invention, this sequence is used to generate a phantom image, and the phantom image is further used for rapid correction of the main magnetic field as described below. Moreover, in step S310, other imaging sequences having variable resonant frequencies may also be used to generate a plurality of images corresponding to different resonant frequencies.

In step S310, a plurality of sets of image data of the phantom may be obtained by causing corresponding components of the scanner 110 to perform the first imaging sequence on the phantom, the image reconstructor 120 is used to reconstruct the plurality of sets of images based on the plurality of sets of image data, and the image analysis processor 130 may further be used to synthesize the plurality of sets of images to generate the estimated image. In other implementations, the image reconstructor 120 may be used to reconstruct the plurality of sets of images and synthesize the images, or the image analysis processor 130 may be used to directly synthesize and reconstruct the estimated image based on the plurality of sets of image data, or after synthesizing the plurality of sets of image data by the image analysis processor 130, the estimated image is reconstructed based on the synthesized image data via the image reconstructor 120.

Due to the utilization of the plurality of resonant frequencies, as much image data under different main magnetic field strengths is obtained as possible, and then the image data under different field strengths are synthesized. In the synthesized image, the phantom may maintain a basic shape without too much deformation. Even if the uniformity of the main magnetic field is poor, it is also possible to avoid generating an excessively distorted image due to the poor uniformity, which facilitates further main magnetic field correction.

In step S320, the main magnetic field is pre-corrected based on the estimated image. Since there may be deformation of the phantom in the estimated image, but the deformation degree is likely to be small, a traditional image-based magnetic field correction method may be used for pre-correction. For example, the pre-correction may include: obtaining correction data of the main magnetic field based on the estimated image, such as an adjusted main magnetic field map. The main magnetic field correction data may be used to guide an operator to perform main magnetic field pre-correction, for example, in one manner, adding or subtracting shimming pieces at appropriate locations. In this step, frequency distribution of the estimated image may be analyzed by the image analysis processor 130, so as to obtain the pre-correction data of the main magnetic field.

In step S330, a scanned image of a phantom is obtained based on the pre-corrected main magnetic field, in step S340, whether a quality of the scanned image is within an acceptable range is determined, and if so, the pre-correction is ended, or if not, step S310 is returned to, until the quality of the scanned image obtained based on the current main magnetic field is within the acceptable range.

In step S330, corresponding components of the scanner 110 may be caused to perform the second imaging sequence to generate image data of the phantom, and reconstruct the scanned image of the phantom based on the image data by the image processor 120. The second imaging sequence may include radio-frequency excitation pulses of a single frequency. Just as an example, the second imaging sequence may be a spin echo (SE) sequence, and those skilled in the art may understand that other imaging sequences may also be used to scan the phantom in the pre-corrected main magnetic field to obtain a scanned image thereof.

Figure 4:
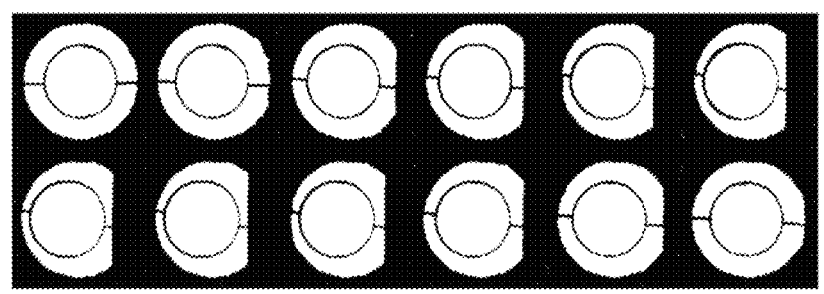
FIG. 4 is an example of a scanned image of a phantom generated based on a pre-corrected main magnetic field in an embodiment of the present invention.
Figure 5:
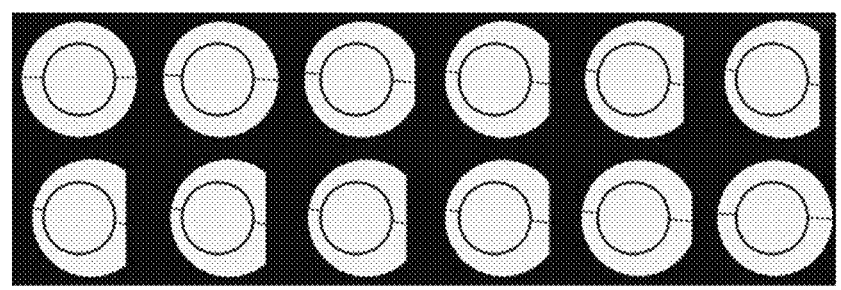
FIG. 5 is an example of a standard image of a phantom.

In step S340, the image analysis processor 130 may be used to determine whether the image quality of the scanned image of the phantom is within the acceptable range. Specifically, the scanned image (as shown in FIG. 4) may be compared with the pre-stored standard image (as shown in FIG. 5) to determine whether the deformation degree of the phantom in the scanned image is within the acceptable range, or to determine whether the deformation degree of the phantom in the scanned image is lower than the preset threshold, if shape similarity of the phantoms in the two images is high, and the deformation degree of the phantom is lower than the preset threshold, the quality of the scanned image is considered acceptable, the main magnetic field is relatively uniform after pre-correction, and the pre-correction may be ended. Conversely, if there is a large difference in the shape of the phantoms in the two images, the quality of the scanned image is considered unacceptable, and further pre-correction for the main magnetic field is required. The standard image may be stored in a memory, and the memory may be integrated with the scanner, the image reconstructor 120, the image analysis processor 130 or the controller 140.

In an implementation, suitable frequency variation ranges and frequency values may be set for the plurality of radio-frequency transmit pulses of the first imaging sequence. For example, frequencies of a set of radio-frequency excitation pulses of the first imaging sequence may be 63.75 MHz, 63.77 MHz, 63.79 MHz, 63.81 MHz, 63.83 MHz, 63.85 MHz, 63.87 MHz, 63.89 MHz, 63.91 MHz, 63.93 MHz, 64.95 MHz, 63.97 MHz, or 63.81 MHz, 63.82 MHz, 63.83 MHz, 63.84 MHz, 63.85 MHz, 63.86 MHz, 63.87 MHz, 63.88 MHz, 63.89 MHz, 63.90 MHz, 64.91 MHz, 63.92 MHz. By setting an appropriate set of resonant frequencies, more accurate B0 field data may be obtained under a limited quantity of radio-frequency transmit pulses, thereby improving accuracy of pre-correction.

Figure 6:
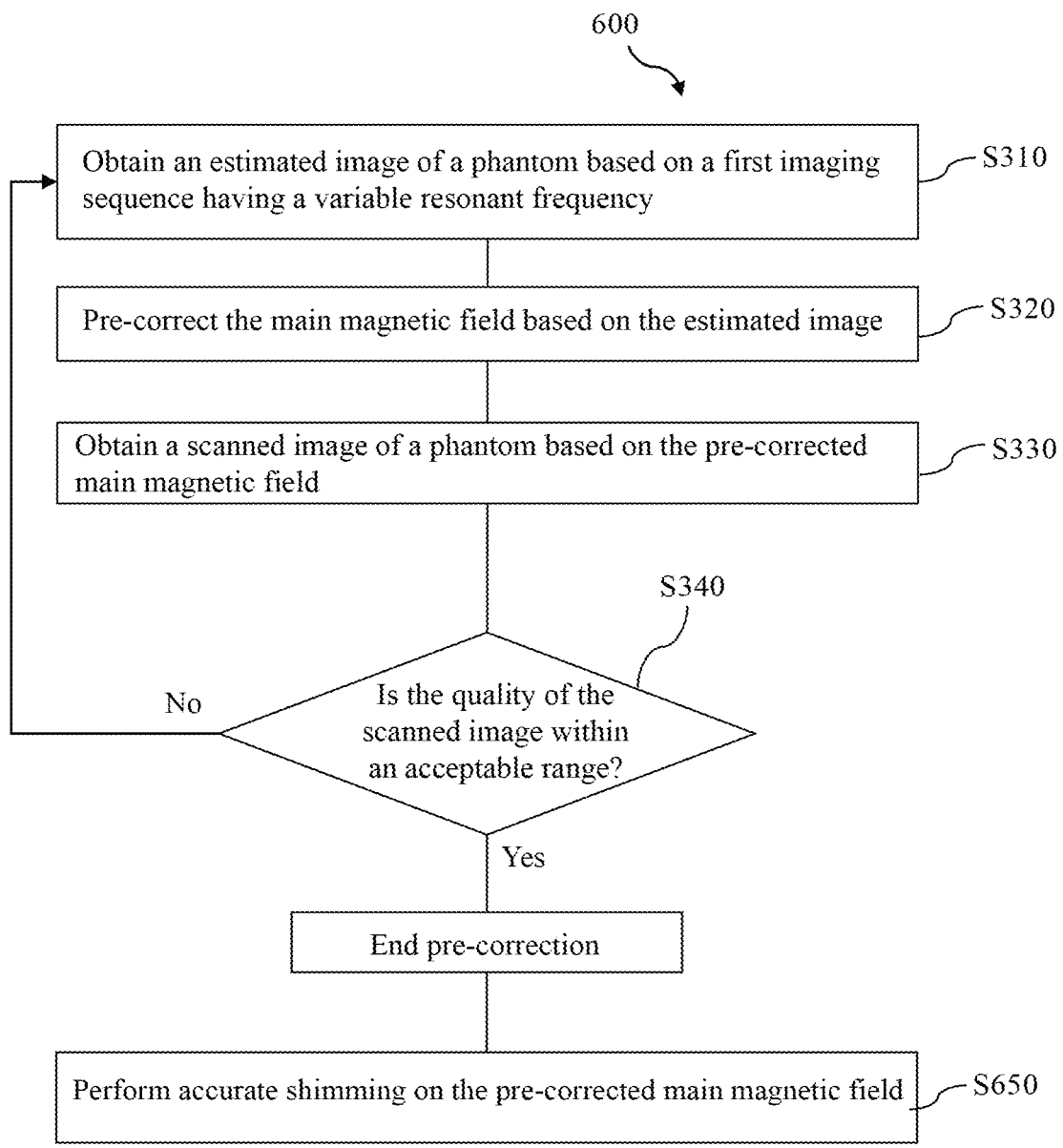
FIG. 6 is a flowchart of a main magnetic field correction method according to another embodiment of the present invention.

FIG. 6 is a flowchart 600 of a main magnetic field correction method according to another embodiment of the present invention, and may include the steps shown in FIG. 3. Further, in step S650, after the pre-correction is completed, that is, if the quality of the scanned image of the object is within an acceptable range, accurate shimming is performed on the pre-corrected main magnetic field. In the pre-correction, the magnetic field correction is performed based on the estimated image, and accuracy of the obtained main magnetic field correction data may be insufficient due to estimated rather than actual scanned data in the estimated image, and therefore, performing accurate shimming after the pre-correction may further avoid such a problem.

The aforementioned steps of accurate shimming may specifically include: obtaining a first shimming image and a second shimming image of a phantom based on a third imaging sequence, the first shimming image and the second shimming image having a phase offset therebetween; and performing shimming correction on the pre-corrected main magnetic field based on a phase difference between the first shimming image and the second shimming image.

Specifically, the third imaging sequence includes a radio-frequency excitation pulse, a radio-frequency refocusing pulse, a layer selection gradient pulse, a phase encoding pulse, a first frequency encoding pulse, and a second frequency encoding pulse, the first frequency encoding pulse and the second frequency encoding pulse being adjacent and having a preset interval, wherein the first frequency encoding pulse is used to generate first echo data to generate the first shimming image, and the second frequency encoding pulse is used to generate second echo data to generate the second shimming image. When the first frequency encoding pulse ends, due to non-uniformity of the main magnetic field, the protons may have different degrees of phase shift, and such a phase difference may be reflected in corresponding images. Therefore, the second shimming image may be generated by the second encoding pulse having a preset delay compared with the first frequency encoding pulse, the main magnetic field map may be calculated based on the phase difference between the two shimming images, and the shimming data is generated.

Figure 7:
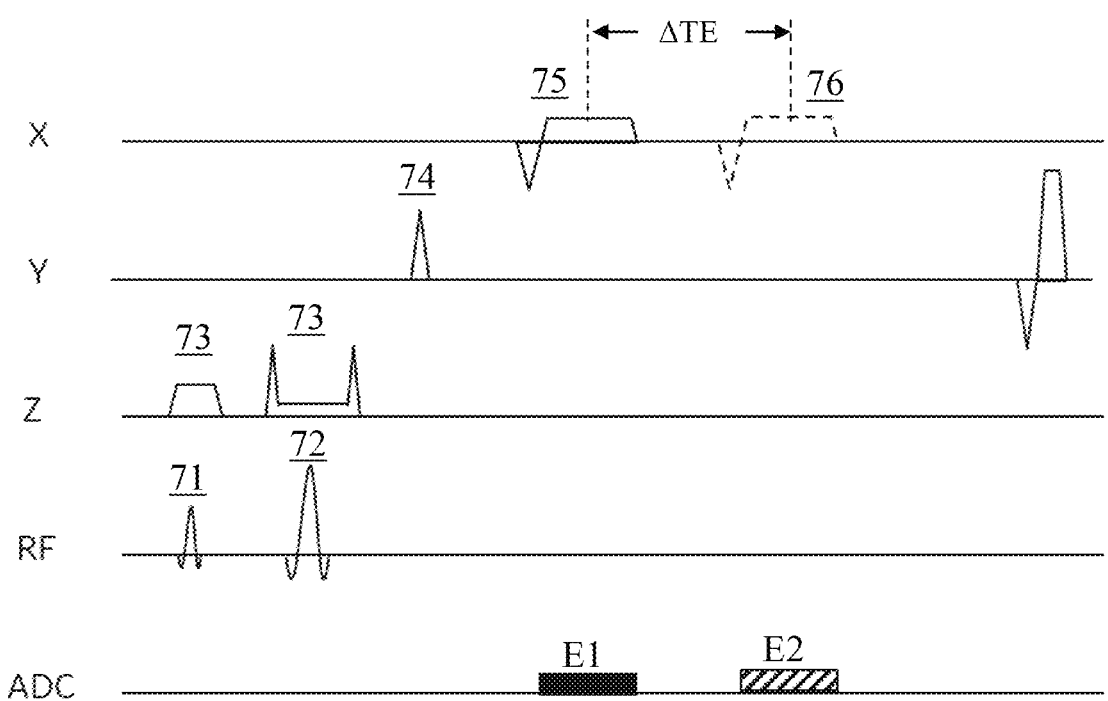
FIG. 7 is an example of a third imaging sequence according to an embodiment of the present invention.

FIG. 7 illustrates an example of the third imaging sequence. It should be understood that the illustrated sequences are merely some of sequences for performing shimming scanning. For example, only sequences within one repetition time (TR) are illustrated, and those skilled in the art would understand that the repetition time refers to a time interval between two adjacent radio-frequency transmit pulses of an imaging sequence. The sequences shown in FIG. 7 may further include other pulses, and the other pulses may be, for example, located between any two adjacent pulses. The example of the present invention is used only for illustrating the sequential relationship between the pulses shown in FIG. 7, rather than limiting the sequential relationship between these pulses and other pulses not shown.

As shown in FIG. 7, two echoes E1 and E2 are continuously obtained within each repetition time of the third imaging sequence to obtain first image data and second image data. The word "continuously" may mean that no other sequence pulses are performed in the process that the two echoes are successively performed. As an example, the third imaging sequence includes a radio-frequency transmit pulse 71. The radio-frequency transmit pulse 71 may have a flip angle of 90 degrees and is for controlling a radio-frequency transmit coil of a magnetic resonance imaging system to transmit a radio-frequency signal to a patient. The radio-frequency signal has a preset resonant frequency to excite resonance of protons of tissue of interest. In addition to the radio-frequency transmit pulse 71, a radio-frequency refocusing pulse 72 is further included for performing phase refocusing on a transverse magnetization vector generated after the radio-frequency excitation pulse ends. Optionally, the third imaging sequence further includes a layer selection gradient pulse 73 emitted simultaneously with the radio-frequency transmit pulse 71 and the refocusing pulse 72. The layer selection gradient pulse 73 is for controlling a gradient coil in a Z direction of the magnetic resonance imaging system to apply a gradient to a static magnetic field B0, so as to provide position information in the Z direction to the first image data and the second image data. A phase encoding gradient pulse 74 is further included after the layer selection gradient pulse 73 and is for controlling a gradient coil in a Y direction to apply a gradient to the static magnetic field B0, so as to provide position information in the Y direction to the first image data and the second image data. Frequency encoding gradient pulses 75 and 76 are further included after the phase encoding gradient pulse 74 and are also referred to as read gradient pulses and are for controlling a gradient coil in an X direction of the magnetic resonance imaging system to apply a gradient to the static magnetic field B0, so as to provide position information in the X direction to the first image data and the second image data respectively. The first echo E1 and the second echo E2, namely, free induction decay signals generated due to spin of excited protons in the human body, are respectively generated along with/in response to the frequency encoding gradient pulses 75 and 76. There is a time difference ΔTE between the frequency encoding gradient pulses 75 and 76 and the corresponding first echo E1 and the second echo E2 thereof.

In the embodiments of the present invention, the second imaging sequence for generating the scanned image of the phantom may be similar to the third imaging sequence, except that there is only one frequency encoding gradient pulse and corresponding one echo per repetition time of the second imaging sequence.

Figure 8:
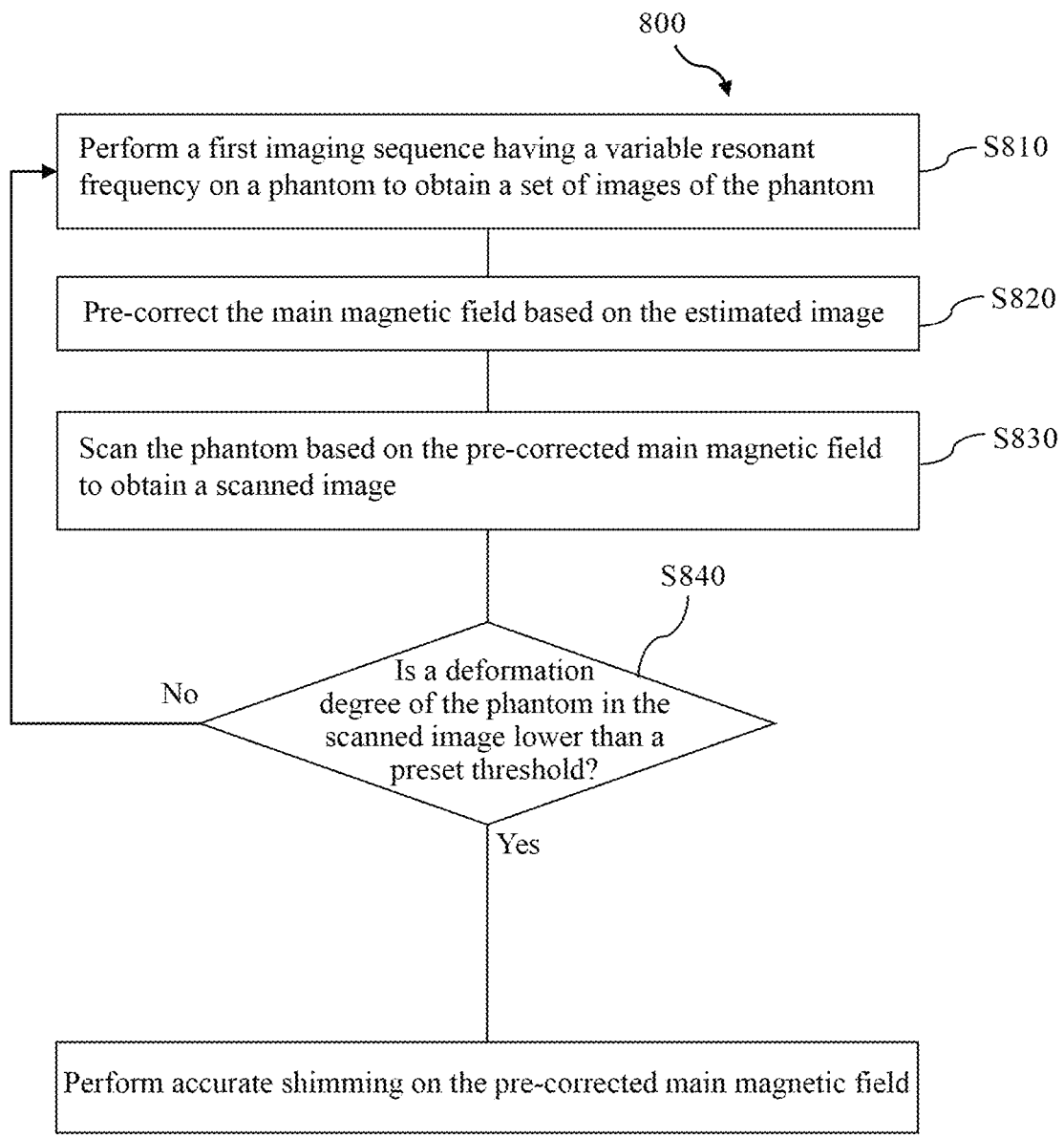
FIG. 8 is a flowchart of a main magnetic field correction method according to another embodiment of the present invention.

FIG. 8 is a flowchart 800 of a main magnetic field correction method according to another embodiment of the present invention. This embodiment has similar principles and implementations to the aforementioned embodiments, wherein: in step S810, a first imaging sequence having a variable resonant frequency is performed on a phantom to obtain a set of images of the phantom, and the set of images is synthesized to generate an estimated image of the phantom. In step S820, the main magnetic field is pre-corrected based on the estimated image and in step S830, the phantom is scanned based on the pre-corrected main magnetic field to obtain a scanned image. Further, in step S840, whether a deformation degree of the phantom in the scanned image exceeds a preset threshold is determined, and if so, a plurality of resonant frequencies of the first imaging sequence are adjusted and step S810 is returned to, and if not, accurate shimming is performed on the pre-corrected main magnetic field.

Embodiments of the present invention may further provide a main magnetic field correction apparatus for a magnetic resonance imaging system, a magnetic resonance imaging system, and a computer-readable storage medium. Principles and examples are described in detail when describing the main magnetic field correction method of the embodiments of the present invention. The magnetic resonance system, the main magnetic field correction apparatus, and the computer-readable storage medium of the embodiments of the present invention may be used to implement the method in any of the aforementioned embodiments, which has an inventive concept that is the same as this method.

Figure 9:
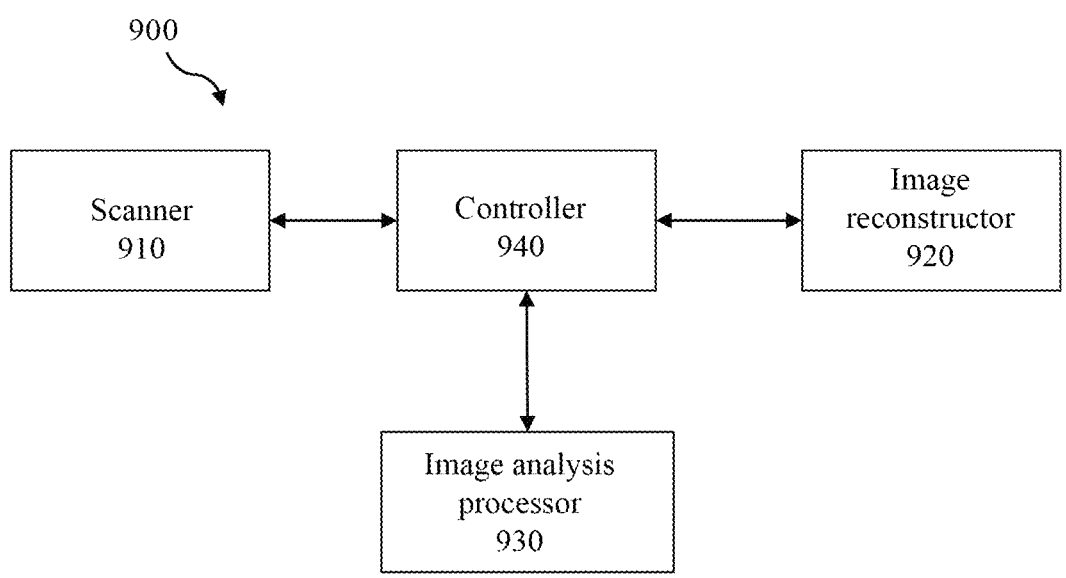
FIG. 9 is a flowchart of a magnetic resonance imaging system according to another embodiment of the present invention.

FIG. 9 is a block diagram of a magnetic resonance imaging system according to an embodiment of the present invention, and each component may have a similar structure and operating principle to a corresponding component shown in FIG. 1. As shown in FIG. 9, the system may include a scanner 910, an image reconstructor 920, an image analysis processor 930, and a controller 940.

The scanner 910 is configured to scan an object to obtain image data of the object, and the object includes a phantom. For example, the scanner 910 may obtain estimated image data of the phantom by performing a first imaging sequence, obtain scanned image data of the phantom by performing a second imaging sequence, and obtain a first shimming image data and second shimming image data of the phantom by performing a third imaging sequence.

The image reconstructor 920 is configured to reconstruct a corresponding image based on the image data.

The image analysis processor 930 is configured to obtain correction data and image quality evaluation data of the main magnetic field based on the image of the object. For example, the image analysis processor 930 synthesizes the estimated image data to generate an estimated image, and obtains pre-correction data of the main magnetic field based on the estimated image, determines whether the scanned image is acceptable, and obtains accurate shimming data of the main magnetic field based on a phase difference between the first shimming image and the second shimming image.

The controller 940 is configured to control the scanner 910, the image reconstructor 920, and the image analysis processor 930 to perform the magnetic field correction method in any of the aforementioned embodiments.

The computer-readable storage medium of the embodiments of the present invention includes a stored computer program, wherein the magnetic field correction method in any of the aforementioned embodiments is performed when the computer program is run.

The magnetic field correction apparatus in the embodiments of the present invention may include a first control module, a pre-correction module, a second control module, and a determination module.

The first control module is configured to control the magnetic resonance imaging system to obtain an estimated image of a phantom based on a first imaging sequence having a variable resonant frequency, for example, to control the magnetic resonance imaging system to execute the first imaging sequence to obtain a plurality of sets of image data, and reconstruct and synthesize the plurality of sets of image data to obtain an estimated image.

The pre-correction module is configured to pre-correct the main magnetic field of the magnetic resonance imaging system based on the estimated image.

The third control module is configured to control the magnetic resonance imaging system to obtain a scanned image of a phantom based on the pre-corrected main magnetic field. For example, scanned data of the phantom is obtained by performing the second imaging sequence on the pre-corrected phantom, and the scanned data is reconstructed to obtain the scanned image.

The determination module is configured to determine whether the quality of the scanned image is within the acceptable range, and if not, the first imaging module is used to control the magnetic resonance imaging system to obtain the estimated image again, the pre-correction module is used to pre-correct the main magnetic field again, and the second control module is used to control the magnetic resonance imaging system again to obtain the scanned image of the phantom.

Optionally, the first control module includes: a second control unit, configured to control the magnetic resonance imaging system to image the phantom respectively based on a plurality of radio-frequency excitation pulses, to obtain a plurality of images to be synthesized, the plurality of radio-frequency excitation pulses having different frequencies;

and an image synthesizing unit, configured to synthesize the plurality of images to be synthesized to generate the estimated image.

Optionally, the apparatus further includes an adjustment module, configured to adjust a plurality of resonant frequencies of the first imaging sequence when the quality of the scanned image is not within the acceptable range, such that the first control module controls the magnetic resonance imaging system to obtain the estimated image of the phantom again based on adjusted resonant frequencies.

Optionally, the second control module is configured to control the magnetic resonance imaging system to obtain a scanned image of a phantom based on the pre-corrected main magnetic field and the second imaging sequence.

Optionally, the apparatus may further include an accurate shimming module, and if the quality of the scanned image is within the acceptable range, accurate shimming is performed on the pre-corrected main magnetic field by the accurate shimming module.

Optionally, the accurate shimming module includes: a first control unit, configured to control the magnetic resonance imaging system to obtain a first shimming image and a second shimming image of a phantom based on a third imaging sequence, the first shimming image and the second shimming image having a phase offset therebetween; and an accurate correction unit, configured to perform shimming correction on the pre-corrected main magnetic field based on a phase difference between the first shimming image and the second shimming image.

Optionally, the third imaging sequence includes a radio-frequency excitation pulse, a radio-frequency refocusing pulse, a layer selection gradient pulse, a phase encoding pulse, a first frequency encoding pulse, and a second frequency encoding pulse, the first frequency encoding pulse and the second frequency encoding pulse being adjacent and having a preset interval, where the first frequency encoding pulse is used to generate first echo data to generate the first shimming image, and the second frequency encoding pulse is used to generate second echo data to generate the second shimming image.

Optionally, the determination module is configured to determine whether a deformation degree of the phantom in the scanned image is within an acceptable range by comparing the scanned image with a pre-stored standard image.

Experiments have proved that after main magnetic field correction is performed based on the embodiments of the present invention, uniformity of the main magnetic field is very close to uniformity of a main magnetic field corrected based on a magnetometer. However, in the embodiments of the present invention, complex structures and operations are not required, and even a main magnetic field having very poor uniformity can be quickly corrected to an acceptable level (for example, a traditional correction method based on phantom imaging can be used more easily in the future for accurate shimming) via pre-correction, which avoids complex calculations, and obtaining a uniform main magnetic field is easier.

As used herein, "module," "unit," "controller," "processor," and the like may be in the form of software, hardware, or a combination of software and hardware, which may include a circuit configured to perform one or more tasks, functions, or steps discussed herein. The "controller", "control unit", "control module", and "processor" used herein are not intended to necessarily be limited to a single processor or computer. For example, a plurality of processors, ASICs, FPGAs and/or computers may be included, and the plurality of processors, ASICs, FPGAs and/or computers may be integrated in a common housing or unit, or may be distributed among various units or housings. The depicted "controller", "control unit", "control module", and "processor" include a memory. The memory may include one or more computer-readable storage media. For example, the memory may store images (for example, estimated images, scanned images, standard images, first shimming images, second shimming images) and system information (for example, correction data of the main magnetic field), and is used to perform an algorithm, a process, and the like in any of the aforementioned embodiments. Further, the process flow and/or flowchart (or aspects thereof) discussed herein may represent one or more instruction sets stored in the memory for guiding a shimming process of the main magnetic field.

As used herein, an element or step described as singular and preceded by the word "a" or "an" should be understood as not excluding such element or step being plural, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional elements that do not have such property. The terms "including" and "in which" are used as the plain-language equivalents of the respective terms "comprising" and "wherein". Furthermore, in the appended claims, the terms "first", "second," "third" and so on are used merely as labels, and are not intended to impose numerical requirements or a particular positional order on their objects.

This written description uses examples to disclose the present invention, including the best mode, and also to enable those of ordinary skill in the relevant art to implement the present invention, including making and using any devices or systems and performing any incorporated methods. The patentable scope of the present invention is defined by the claims, and may include other examples that occur to those skilled in the art. Such other examples are intended to be within the scope of the claims if they have structural elements that do not differ from the literal language of the claims, or if they include equivalent structural elements without substantial differences from the literal language of the claims.

The invention claimed is:

1. A main magnetic field correction method for a magnetic resonance imaging system, comprising:
    obtaining an estimated image of a phantom based on a first imaging sequence, the first imaging sequence having a variable resonant frequency;
    pre-correcting a main magnetic field based on the estimated image;
    obtaining a scanned image of the phantom based on the pre-corrected main magnetic field; and
    determining whether the quality of the scanned image is within an acceptable range, and if not, returning to the step of obtaining the estimated image.

2. The method according to claim 1, wherein the step of obtaining the estimated image comprises:
    imaging the phantom respectively based on a plurality of radio-frequency excitation pulses to obtain a plurality of images to be synthesized, the plurality of radio-frequency excitation excitation pulses having different frequencies; and
    synthesizing the plurality of images to be synthesized to generate the estimated image.

3. The method according to claim 1, wherein the first imaging sequence is a MAVRIC sequence.

4. The method according to claim 1, wherein the scanned image is obtained based on the pre-corrected main magnetic field and a second imaging sequence.

5. The method according to claim 1, wherein the step of determining whether the quality of the scanned image is within an acceptable range comprises: determining whether a deformation degree of the phantom in the scanned image is within an acceptable range by comparing the scanned image with a pre-stored standard image.

6. The method according to claim 1, further comprising:
if the quality of the scanned image is within an acceptable range, performing accurate shimming on the pre-corrected main magnetic field.

7. The method according to claim 6, wherein the accurate shimming comprises:
obtaining a first shimming image and a second shimming image of the phantom based on a third imaging sequence, the first shimming image and the second shimming image having a phase offset therebetween; and
performing shimming correction on the pre-corrected main magnetic field based on a phase difference between the first shimming image and the second shimming image.

8. The method according to claim 7, wherein the third imaging sequence comprises a radio-frequency excitation pulse, a radio-frequency refocusing pulse, a layer selection gradient pulse, a phase encoding pulse, a first frequency encoding pulse, and a second frequency encoding pulse, the first frequency encoding pulse and the second frequency encoding pulse being adjacent and having a preset interval, wherein the first frequency encoding pulse is used to generate first echo data to generate the first shimming image, and the second frequency encoding pulse is used to generate second echo data to generate the second shimming image.

9. A non-transitory computer-readable storage medium, comprising a stored computer program, wherein the method according to claim 1 is performed when the computer program is run.

10. A magnetic resonance imaging system, comprising:
a scanner, for scanning an object to obtain image data of the object, the object comprising a phantom;
an image reconstructor, for reconstructing an image of the object based on the image data;
an image analysis processor, for obtaining correction data and image quality determination data of a main magnetic field based on the image of the object; and
a controller, for controlling the scanner, the image reconstructor, and the image analysis processor to perform the method according to claim 1.

11. A main magnetic field correction method for a magnetic resonance imaging system, comprising:
performing a first imaging sequence having a variable resonant frequency on a phantom to obtain a set of images of the phantom, and synthesizing the set of images to generate an estimated image of the phantom;
pre-correcting a main magnetic field based on the estimated image;
scanning the phantom based on the pre-corrected main magnetic field to obtain a scanned image;
determining whether a deformation degree of the phantom in the scanned image is lower than a preset threshold; and
if not, adjusting a plurality of resonant frequencies of the first imaging sequence and returning to the step of performing the first imaging sequence on the phantom, and if so, performing accurate shimming on the pre-corrected main magnetic field.

* * * * *